United States Patent
Cohn et al.

(10) Patent No.: US 7,285,860 B2
(45) Date of Patent: Oct. 23, 2007

(54) METHOD AND STRUCTURE FOR DEFECT MONITORING OF SEMICONDUCTOR DEVICES USING POWER BUS WIRING GRIDS

(75) Inventors: John M. Cohn, Richmond, VT (US); Leah Marie P. Pastel, Essex, VT (US); Thomas G. Sopchak, Williston, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/277,663

(22) Filed: Mar. 28, 2006

(65) Prior Publication Data

US 2006/0170104 A1    Aug. 3, 2006

Related U.S. Application Data

(62) Division of application No. 10/710,114, filed on Jun. 18, 2004, now Pat. No. 7,078,248.

(51) Int. Cl.
*H01L 23/48* (2006.01)
(52) U.S. Cl. ............................. 257/758; 257/E23.144
(58) Field of Classification Search ......... 257/E23.144
See application file for complete search history.

(56) References Cited

U.S. PATENT DOCUMENTS

| | | | |
|---|---|---|---|
| 5,382,831 A | 1/1995 | Atakov et al. ............... 257/767 |
| 6,005,966 A | 12/1999 | Scaman ....................... 382/149 |
| 6,094,812 A | 8/2000 | English et al. ................ 29/852 |
| 6,362,634 B1 | 3/2002 | Jarvis et al. ................. 324/719 |
| 6,528,818 B1 | 3/2003 | Satya et al. .................... 257/48 |
| 6,636,064 B1 | 10/2003 | Satya et al. ................. 324/763 |
| 6,642,726 B2 | 11/2003 | Weiner et al. .............. 324/751 |
| 6,751,519 B1 | 6/2004 | Satya et al. ................. 700/121 |
| 6,774,648 B1 | 8/2004 | Lin et al. .................... 324/752 |
| 2004/0001326 A1 | 1/2004 | Tomsio et al. .............. 361/775 |

OTHER PUBLICATIONS

Solutions for Maximizing Die Yield at 0.13μm, [online]; [retrieved on Apr. 27, 2004]; retrieved from the Internet http://cgw.pennnet.com/Articles/Article_Display.cfm?Section=Articles&Subsection=Display.

*Primary Examiner*—Lex Malsawma
(74) *Attorney, Agent, or Firm*—Cantor Colburn LLP; Michael J. LeStrange

(57) ABSTRACT

A method for implementing defect inspection of an integrated circuit includes configuring a power bus grid structure on a first metal interconnect level, the power bus grid structure including a first plurality of wire pairs. The first plurality of wire pairs is arranged in a manner such that a first wire in each of the first plurality of wire pairs is electrically coupled to conductive structures beneath the first metal interconnect level, and a second wire in each of the first plurality of wire pairs is initially electrically isolated from the conductive structures beneath the first metal interconnect level. The first wire in each of the first plurality of wire pairs is biased to a known voltage, and a charge contrast inspection is performed between the first wire and the second wire of each of the first plurality of wire pairs.

3 Claims, 4 Drawing Sheets

METHOD AND STRUCTURE FOR DEFECT MONITORING OF SEMICONDUCTOR DEVICES USING POWER BUS WIRING GRIDS

CROSS REFERENCE TO RELATED APPLICATION

This application is a divisional application of U.S. Ser. No. 10/710,114, filed Jun. 18, 2004, now U.S. Pat. No. 7,078,248. the contents of which are incorporated by reference herein in their entirety.

BACKGROUND

The present invention relates generally to semiconductor device manufacturing, and, more particularly, to a method and structure for defect monitoring of semiconductor devices using power bus wiring grids.

In the semiconductor integrated circuit (IC) industry, there is a continuing demand for higher circuit packing densities. This demand of increased packing densities has in turn led the semiconductor industry to develop new materials and processes to achieve sub-micron device dimensions. Because manufacturing ICs at such minute dimensions adds more complexity to circuits, the demand for improved methods to inspect the integrated circuits in various stages of their manufacture is ever present.

Although inspection of such products at various stages of manufacture is desirable and can significantly improve production yield and product reliability, the increased complexity of ICs increases the cost of such inspections, both in terms of expense and time. However, if a defect can be detected early in production, the cause of the defect can be determined and corrected before a significant number of defective ICs are manufactured. In this regard, defect-detecting systems frequently employ charged particle beams for a "voltage contrast" inspection technique in which a charged particle beam, such as an electron beam, is irradiated on certain defect test structures.

The interaction of the electron beam with features in the circuitry generates a number of signals in varying intensities, such as secondary electrons, back-scattered electrons, x-rays, etc. The voltage contrast inspection technique operates on the principle that potential differences in the various locations of a test structure under examination cause differences in secondary electron emission intensities. Thus, the potential state of the scanned area is acquired as a voltage contrast image such that a low potential portion of, for example, a wiring pattern might be displayed as bright (i.e., the intensity of the secondary electron emission is high) and a high potential portion might be displayed as dark (i.e., lower intensity secondary electron emission). Alternatively, the system may be configured such that a low potential portion might be displayed as dark and a high potential portion might be displayed as bright.

A secondary electron detector is used to measure the intensity of the secondary electron emission that originates only at the path swept by the scanning electron beam. Thus, a defective portion of the IC may be identified from the potential state of the portion under inspection. In one form of voltage contrast inspection, the mismatched portion between the defective voltage contrast image and the defect free contrast image reveals the defect location. Alternatively, an ion beam may be used, wherein the defects from the inspection are (more generally) revealed through charge contrast.

Typically, in order to facilitate the charge contrast inspection process, manufacturers fabricate semiconductor defect test structures specifically dedicated for the defect analysis. These defect test structures are fabricated such that they are sensitive to defects that occur in IC product, but are designed so that the presence of defects is more readily ascertained. However, such defect test structures are conventionally constructed within the kerf area of the silicon wafer instead of the product die, and therefore the defect density measurements do not necessarily correlate as well to actual defect conditions on the product die. On the other hand, using the product die itself to construct inspection test structures reduces the available area on the die for the actual IC structures themselves.

Accordingly, it would be desirable to be able to implement an effective defect monitoring method as each wiring layer is formed, and in a manner that uses less silicon area than traditional kerf-based defect monitors.

SUMMARY

The foregoing discussed drawbacks and deficiencies of the prior art are overcome or alleviated by a method for implementing defect inspection of an integrated circuit. In an exemplary embodiment, the method includes configuring a power bus grid structure on a first metal interconnect level, the power bus grid structure including a first plurality of wire pairs. The first plurality of wire pairs is arranged in a manner such that a first wire in each of the first plurality of wire pairs is electrically coupled to conductive structures beneath the first metal interconnect level, and a second wire in each of the first plurality of wire pairs is initially electrically isolated from the conductive structures beneath the first metal interconnect level. The first wire in each of the first plurality of wire pairs is biased to a known voltage, and a charge contrast inspection is performed between the first wire and the second wire of each of the first plurality of wire pairs.

In another embodiment, a method for implementing defect inspection of an integrated circuit includes configuring a power bus grid structure on a first metal interconnect level, the power bus grid structure including a first plurality of parallel wire pairs disposed in a first direction. The first plurality of wire pairs are arranged in a manner such that a first wire in each of the first plurality of parallel wire pairs is electrically coupled to conductive structures beneath the first metal interconnect level, and a second wire in each of the first plurality of parallel wire pairs is initially electrically isolated from the conductive structures beneath the first metal interconnect level. The first wire in each of the first plurality of parallel wire pairs is biased to a known voltage, and a charge contrast inspection is performed between the first wire and the second wire of each of the first plurality of parallel wire pairs.

In still another embodiment, an integrated circuit power bus grid structure adapted for monitoring manufacturing defects includes a first plurality of wire pairs formed on a first metal interconnect level, the first plurality of wire pairs arranged in a manner such that a first wire in each of the first plurality of wire pairs is electrically coupled to conductive structures beneath the first metal interconnect level, and a second wire in each of said first plurality of wire pairs is initially electrically isolated from the conductive structures beneath the first metal interconnect level.

BRIEF DESCRIPTION OF THE DRAWINGS

Referring to the exemplary drawings wherein like elements are numbered alike in the several Figures.

DETAILED DESCRIPTION

Disclosed herein is a method and structure for defect monitoring of semiconductor devices, in which designed modification to the structure of a chip power grid allows the grid to double as a powerful defect monitor. This on-product approach both tracks actual product defect levels, as well as utilizes less silicon area than traditional kerf-based defect monitors. Briefly stated, in order to allow the power grid to double as a defect monitor, the segments of the grid are configured into multiple, parallel wire pairs in lieu of conventional "cheesed" or slotted wires characteristic of a conventional grid. Thus configured, a charge contrast inspection can then be used to detect open and short defects that affect the parallel wire structures. Furthermore, in order to facilitate the testing itself, the placement of the interlevel vias is carefully controlled, as will be described in further detail hereinafter.

Figure 1:
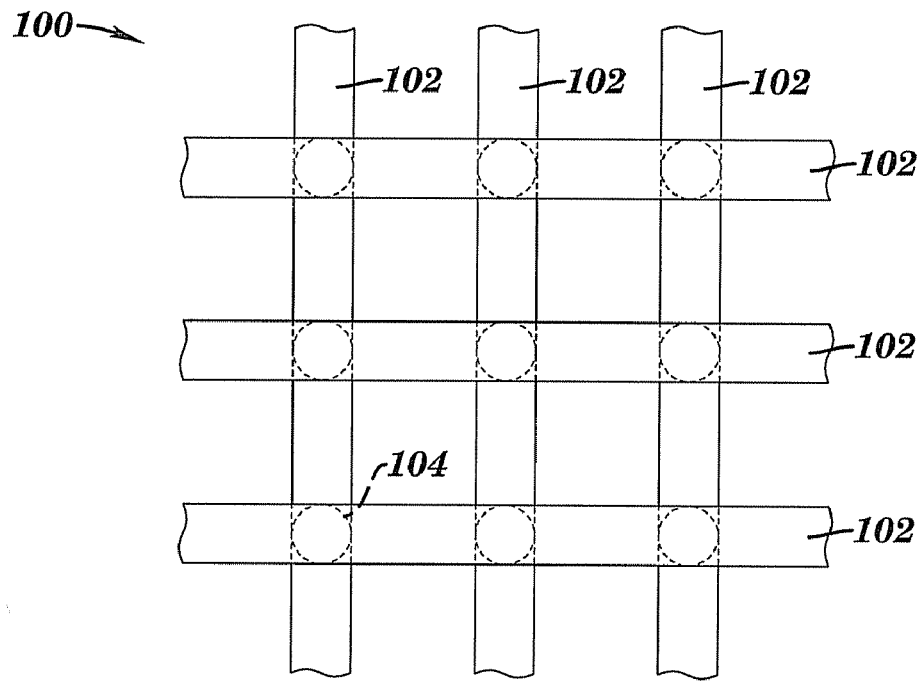
FIG. 1 is a plan view of a portion of a conventional uniform power wiring grid used for a generic integrated circuit.

Referring initially to FIG. 1, there is shown a plan view of a portion of a conventional uniform power wiring grid 100 used for a generic ASIC (Application Specific Integrated Circuit). As is shown, the grid 100 includes wide strips of metal 102 (e.g., copper) spaced at regular intervals on each layer of the semiconductor device. The direction of the wires is orthogonally altered from wiling level to wiring level, which levels are interconnected at certain intersection points therebetween through vertically disposed via connections 104. Although a power grid generally includes wiring on each routing layer, for exemplary purposes the wiring in FIG. 1 is illustrated for wiring levels M4 and M5, as well as via level V4 therebetween.

In order to ensure uniform manufacturing as device size continues to decrease, the wide metal lines 102 such as those used in power busses shown in FIG. 1 are often "cheesed" or slotted by having a uniform pattern of holes (e.g., circular, rectangular, square) formed therein to help balance metal edge density for uniform polishing. In particular, certain ASIC images require cheesing for power grid lines formed above the M4 level. An example of cheesing within a power grid 200 is shown in FIG. 2, wherein the individual metal lines 202 are formed with a plurality of holes 204 formed therein.

Figure 2:
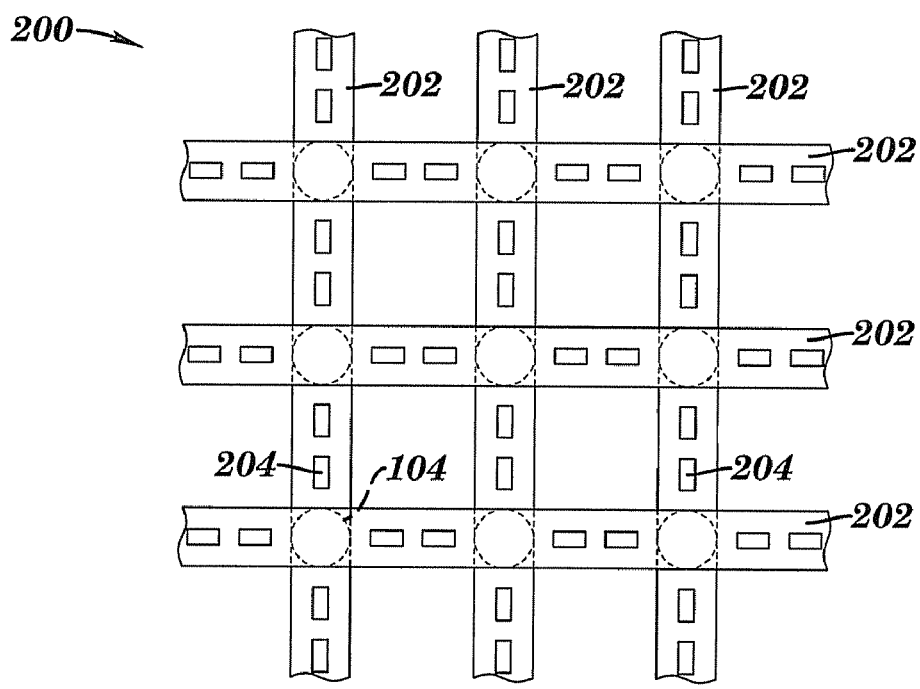
FIG. 2 is a plan view of a portion of another conventional power wiring grid employing cheesing in the individual wires thereof.
Figure 3:
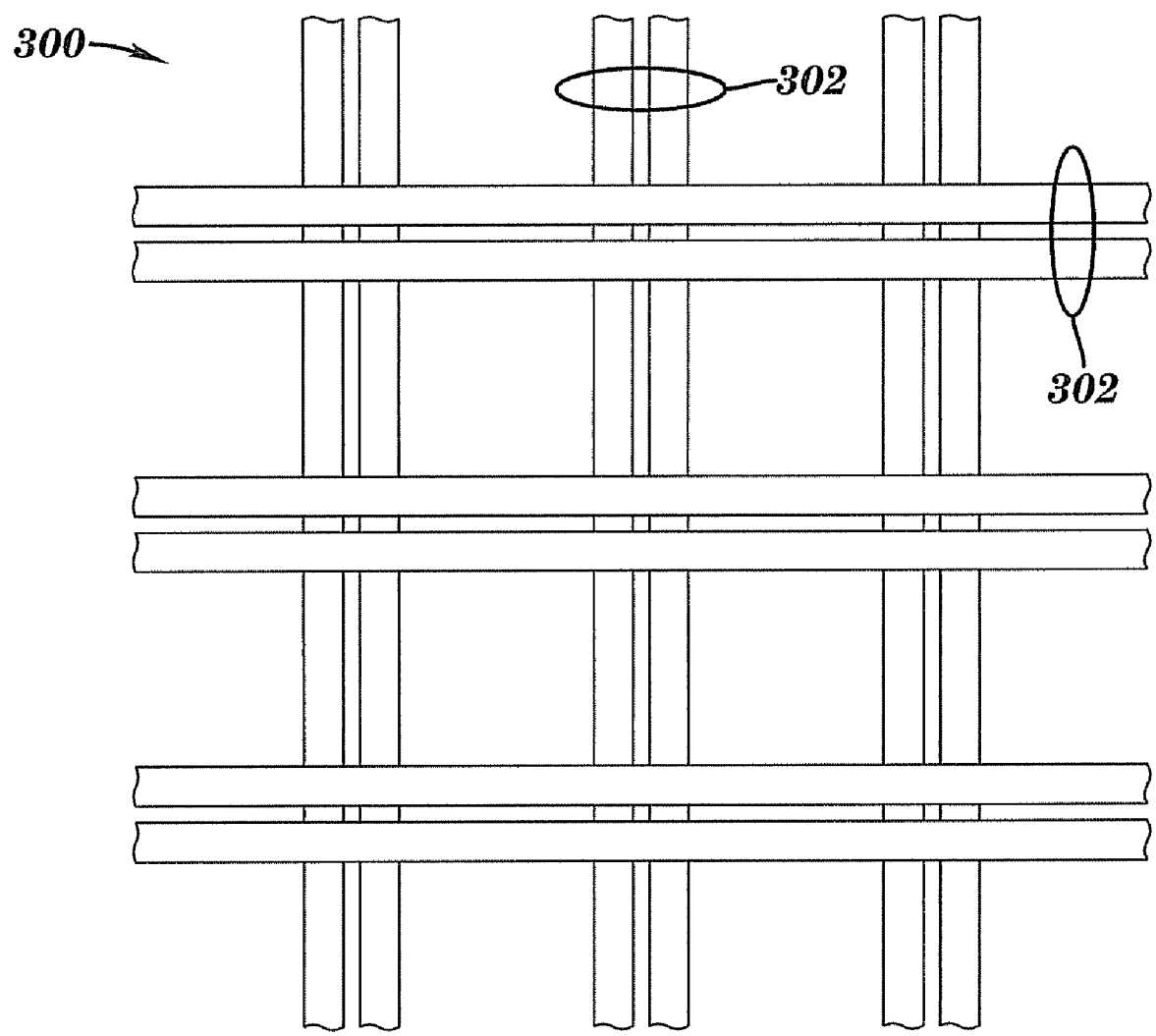
FIG. 3 is a plan view of a portion of a power wiring grid for an integrated circuit particularly configured for defect monitoring, in accordance with an embodiment of the invention.

In accordance with an embodiment of the invention, it has been observed that each of the cheesed wires 202 shown in FIG. 2, for example, could be replaced with a split grid 300 featuring a pair of narrower, parallel wires 302 as shown in FIG. 3, and without incurring a significant loss of current density. An electrical connection between each pair of parallel wires may be made using the interlevel vias and the interlevel intersections. However, in order to compensate for a slightly higher resistance in the power grid due to the split rail configuration, the grid periodicity may be adjusted and/or the via quantity increased to ensure a sufficiently low power supply resistance and current density robustness. Although in the exemplary embodiment depicted, the wire pairs appear to be substantially equivalent in width, it is also contemplated that one of the pairs could be wider than the other for primary current carrying responsibility.

The split rail configuration of FIG. 3 introduces a very large amount of critical area as a result of the large amount of parallel routing at minimum pitch, thereby making the structure very sensitive to bridging defects on all layers. Since the parallel wires for completed lower wiring levels are shorted together by the vias, a bridging fault between any of the split rail pairs would not have an actual impact on device function or yield. Advantageously, the present invention embodiments utilize this large amount of non-yield impacting critical area to provide an effective measure of defect density using every product chip.

In order for any defects to be detected, a charge (e.g., voltage) inspection method is utilized, in accordance with a further embodiment of the invention. As indicated previously, a voltage contrast inspection allows for direct visual measurements of the voltage present on a given wire. More specifically, with an in-line voltage contrast method, for example, selected wires can be tied to a known potential (e.g., ground), and can thus be visually distinguished from those wires tied to another potential (e.g., $V_{DD}$) or left at a floating potential. Through careful planning of the interlevel via locations, combined with the split pair grid layout, one member of the wire pair is biased to a known potential (e.g., ground), while the other member of the pair is left floating until the next set of interlayer vias are formed thereon. In this manner, as each new power routing layer (level) is formed, in-line voltage contrast measurements may be made at that time since one of the wires in the pair is formed in contact with the underlying vias, while the other wire in the pair is not.

A defect that shorts a floating segment in a particular split rail pair to the adjacent, biased wire in the pair would be visually distinguishable from other pairs having no defects, and may be analyzed using simple image processing techniques. Data gathered in this manner would provide a detailed insight as to the defect density on each routing layer. In addition, wafers that are not in conformity with specifications from a defect density standpoint can be scrapped at an intermediate level of manufacture, thereby saving additional (and significant) downstream manufacturing costs.

Figure 4A:
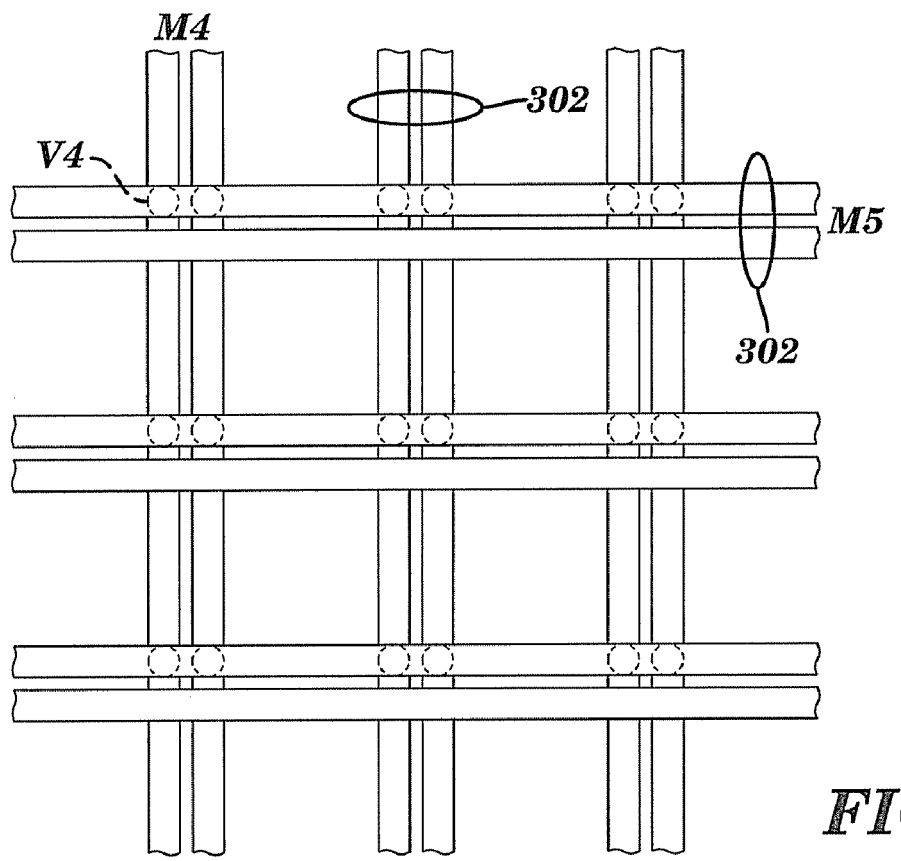
FIG. 4(a) is a plan view of the split rail power wiring grid of FIG. 3, particularly illustrating one possible arrangement of via contacts between wiring levels.

In an exemplary embodiment, the biasing scheme may be implemented by restricting the alignment of all interlayer vias on a given via level to only one member of each pair of split wires. For example, FIG. 4(a) illustrates one possible arrangement of via patterning on the V4 layer between M4 and M5. It will be noted that the V4 vias are aligned so as to contact only the top most wire in each split pair on the M5 level. Therefore, at this stage of the manufacturing process, the top wire of each M5 wire pair is in electrical contact with the remaining conductive structures of the power grid below, while the bottom wire of each M5 pair is intended to be uncoupled prior to subsequent via formation thereatop.

Figure 4B:
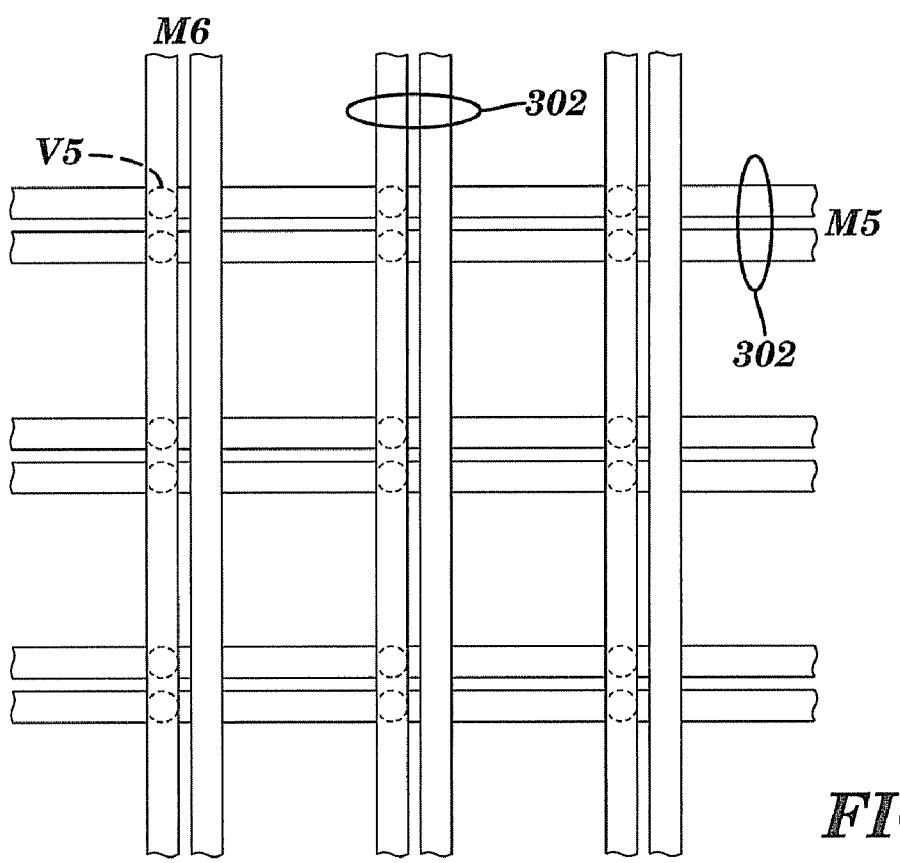
FIG. 4(b) is a plan view of the split rail power wiring grid of FIG. 4(a), particularly illustrating one possible arrangement of via contacts between wiring levels at the next level of device formation.

Similarly, FIG. 4(b) illustrates the formation of the M6 wiring level as well as the V5 vias connected thereto. In particular, the V5 vias are positioned so as to contact only the left most wires in each M6 wire pair. It is further noted that the previously uncoupled bottom wires of the M5 pairs are now coupled by virtue of the V5 vias. Thus, the resulting pattern of vias will tie together all of the parallel split rails from the wiring level directly below, resulting in complete continuity of the grid. Moreover, connection through well or substrate contacts would further allow the entire grid structure (up to the newest manufactured layer) to be biased from either the backside of the wafer or from a single probe point connection.

Figure 5:
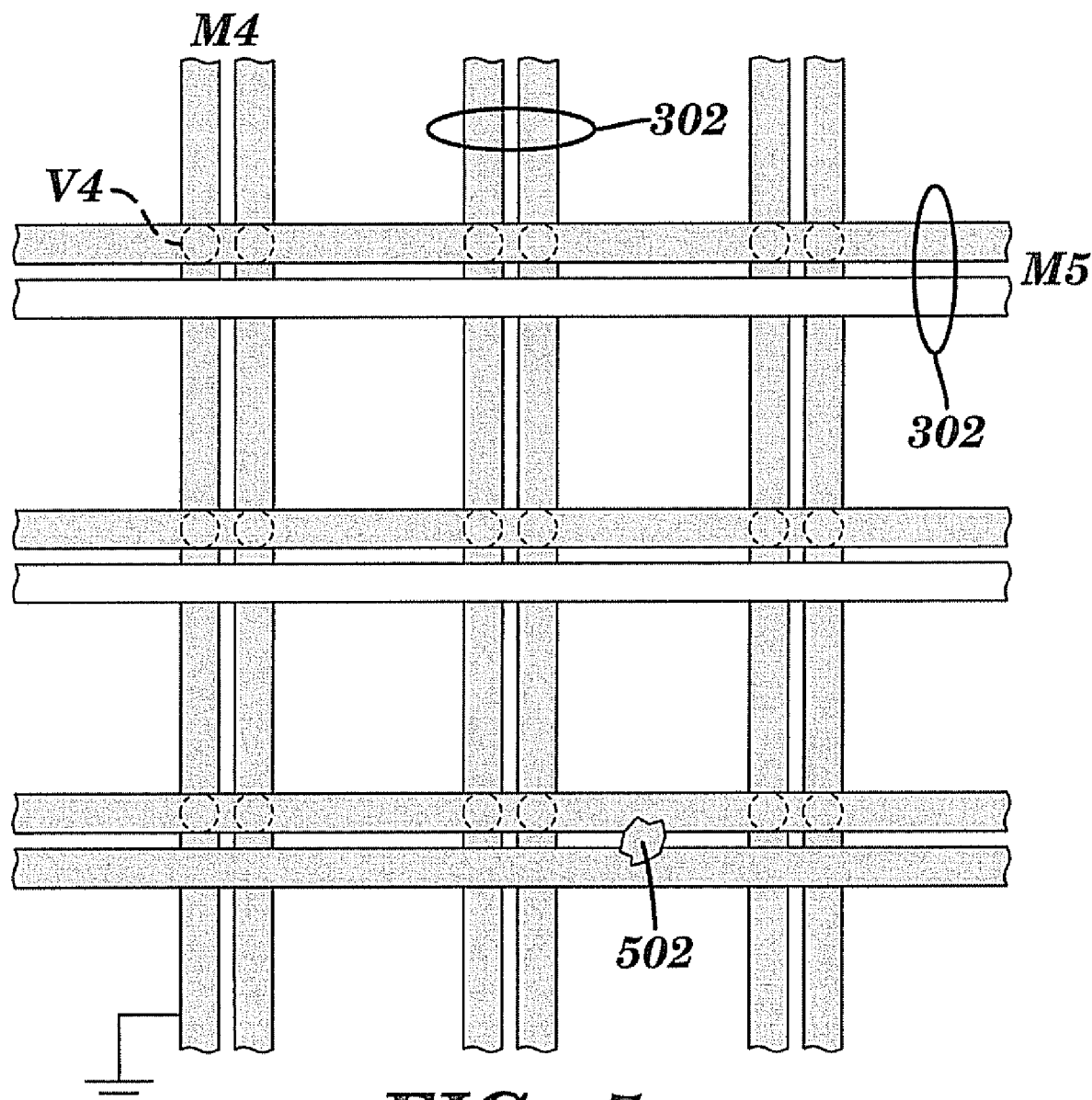
FIG. 5 is an exemplary charge contrast result from an inspection of the grid structure of FIG. 4(a), wherein a defect is present in one of the split rail pairs, in accordance with a further embodiment of the invention.

Finally, FIG. 5 illustrates an exemplary charge contrast result generated by using the above described technique. In the example illustrated, the interconnect structure is completed up to the M5 wiring level. A defect 502 has caused a short between the wires of the bottom M5 pair. Again the V4 level vias are positioned such that only the top wire in each M5 pair is coupled to the M4 wiring and are therefore biased to a determined voltage (e.g., ground). As such, each bottom wire of a properly formed M5 pair at this point will be at a floating potential. Since the bottom wire of the bottom M5 pair is shorted to the top wire, the charge contrast measurement in FIG. 5 reveals the floating, non-faulted wires of the top two M5 pairs to be at a different potential than the biased grid. On the other hand, there is no contrast between the faulted bottom wire of the bottom M5 pair and the rest of the biased grid.

The advantages of the above described grid structure and inspection method are appreciated upon consideration of the fact that defect density measurements are conventionally implemented using kerf structures. Because the present invention embodiments utilize a modified existing structure (i.e., the power wiring grid) that is integrated with each product die, the resulting defect density measurements correlate better to the product than would be the case by measurement of test structures formed on kerf areas. Furthermore, the use of existing chip structures requires less silicon area than would structures of similar sensitivity that could be placed in the kerf. It will be appreciated that the wire-pair approach of the present disclosure need not be implemented for every conductor in a given grid, but could also be used in combination with "unpaired" wires (e.g., by adding a defect monitor pair for every $n^{th}$ wires in a layer). Also, the above described structure(s) need not be limited in use to defect identification. For example, isolated wire pairs may be connected to an external structure, such a probe pad, and thereafter disconnected once the wafer is diced.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit power bus grid structure adapted for monitoring manufacturing defects, comprising:
   a first plurality of wire pairs formed on a first metal interconnect level, said first plurality of wire pairs arranged in a manner such that a first wire in each of said first plurality of wire pairs is electrically coupled to conductive structures beneath said first metal interconnect level, and a second wire in each of said first plurality of wire pairs is initially electrically isolated from said conductive structures beneath said first metal interconnect level;
   a first via level formed over said first metal interconnect level, said first via level having via connections arranged to electrically couple said first and said second wires in each of said plurality of wire pairs in said first metal interconnect level;
   a second metal interconnect level formed over said first via level, said second metal interconnect level including a second plurality of wire pairs; and
   said second plurality of wire pairs arranged in a manner such that a first wire in each of said second plurality of wire pairs is electrically coupled to said via connections of said first via level, and a second wire in each of said second plurality of wire pairs is initially electrically isolated from said via connections of said first via level;
   wherein said first wire in each of said first plurality of wire pairs and said first wire in each of said second plurality of wire pairs are configured to be biased to a known voltage so as to facilitate a charge contrast inspection between said first wire and said second wire of each of said first plurality of wire pairs, and between said first wire and said second wire of each of said second plurality of wire pairs.

2. The structure of claim 1, further comprising:
   a plurality of subsequent via levels and subsequent metal interconnect levels formed above said second metal interconnect level;
   wherein a subsequent $N^{th}$ interconnect level is formed by electrically coupling a first wire in each of an $N^{th}$ plurality of wire pairs to via connections of a corresponding via level directly beneath said $N^{th}$ interconnect level, and a second wire in each of said $N^{th}$ plurality of wire pairs is initially electrically isolated from said via connections of said corresponding via level directly beneath said $N^{th}$ interconnect level.

3. The structure of claim 2, wherein said first wire in each of said $N^{th}$ plurality of parallel wire pairs is configured to be biased to said known voltage so as to facilitate a charge contrast inspection between said first wire and said second wire of each of said $N^{th}$ plurality of parallel wire pairs.

* * * * *